(12) United States Patent
Muradali et al.

(10) Patent No.: US 6,191,603 B1
(45) Date of Patent: Feb. 20, 2001

(54) MODULAR EMBEDDED TEST SYSTEM FOR USE IN INTEGRATED CIRCUITS

(75) Inventors: Fidel Muradali, Mountain View; Robert C. Aitken, San Jose, both of CA (US)

(73) Assignee: Agilent Technologies Inc., Palo Alto, CA (US)

( * ) Notice: Under 35 U.S.C. 154(b), the term of this patent shall be extended for 0 days.

(21) Appl. No.: 09/227,240

(22) Filed: Jan. 8, 1999

(51) Int. Cl.[7] ................................................. G01R 31/26
(52) U.S. Cl. ....................... 324/765; 324/158.1; 714/724
(58) Field of Search ............................ 714/718, 724–726; 324/765, 763, 73.1, 158.1

(56) References Cited

U.S. PATENT DOCUMENTS

| | | | |
|---|---|---|---|
| 5,642,362 | * 6/1997 | Savir | 714/726 |
| 5,951,702 | * 9/1999 | Lim et al. | 714/718 |
| 6,044,481 | * 3/2000 | Kornachuk et al. | 714/724 |

* cited by examiner

*Primary Examiner*—Safet Metjahic
*Assistant Examiner*—Minh Tang

(57) ABSTRACT

An integrated circuit having an embedded testing system. The integrated circuit has a plurality of chip input terminals and a plurality of chip output terminals and operates in a test mode and a normal mode. The integrated circuit includes a plurality of core modules and a test data bus. The test data bus has first and second conductors accessible from the chip input and output terminals, respectively. Each core module includes an access register for storing an access word, and a plurality of registers connected together as a first scan-chain having an input terminal for receiving data to be shifted into the registers and an output terminal for reading data shifted out of the registers. Each core module also includes a scan-in enable circuit and a scan-out enable circuit. The scan-in enable circuit connects the input terminal of the first scan-chain to the first conductor of the test data bus. The scan-out enable circuit connects the output terminal of the first scan-chain to an output terminal associated with the core module. The access word determines the connections and the operations carried out by the core module in the test mode. The access registers of the core modules are connected together to form an access scan-chain having an input terminal accessible from one of the chip input terminals. One of the core modules has an output terminal connected to the second conductor of the test data bus. Core modules may also include other scan-chains used in the testing hardware. In such modules, the scan-in enable and scan-out enable circuits include circuitry for selecting the scan-chain connections to the test data bus and the output terminal of the core module.

6 Claims, 7 Drawing Sheets

MODULAR EMBEDDED TEST SYSTEM FOR USE IN INTEGRATED CIRCUITS

FIELD OF THE INVENTION

The present invention relates to integrated circuits, and more particularly, to a circuit design that allows modules embedded in other circuitry to be more easily tested.

BACKGROUND OF THE INVENTION

Large integrated circuits (VSLI) are usually designed from components provided by a library of circuit modules. The design process involves choosing the correct modules and connecting the modules together to provide the desired functionality. A significant fraction of the improvements in the costs and functions of custom integrated circuits is related to the use of well-characterized libraries of standard cells.

In production, there is always a finite error rate. Hence, the integrated circuits must be tested after the fabrication process to assure that the individual chips do not contain fatal fabrication errors. The testing process involves applying a number of test vectors to the integrated circuit. Each test vector specifies the input signals to be applied to the various inputs of the circuit. The tester then examines the outputs generated by the circuit to determine if the circuit is functioning properly. As circuits become more complex, the number of test vectors needed to thoroughly test the circuit becomes increasingly large, and the testing procedure becomes too costly.

If a chip is found to be defective, it may still be repairable if the location of the fault is known. For example, some chip designs include redundant modules that can be connected in a bus to replace a non-functioning module that is currently connected to the bus. Hence, it would be advantageous to be able to test the individual modules to determine which module is responsible for the fault.

Broadly, it is the object of the present invention to provide an improved integrated circuit design that facilitates testing of the integrated circuit.

It is a further object of the present invention to provide an integrated circuit design that allows individual modules to be tested separately.

These and other objects of the present invention will become apparent to those skilled in the art from the following detailed description of the invention and the accompanying drawings.

SUMMARY OF THE INVENTION

The present invention is an integrated circuit having an embedded testing system. The integrated circuit has a plurality of chip input terminals and a plurality of chip output terminals and operates in a test mode and a normal mode. The integrated circuit includes a plurality of core modules and a test data bus. The test data bus has first and second conductors, the first conductor being accessible from one of the chip input terminals and the second conductor being accessible from one of the chip output conductors. Each core module includes an access register for storing an access word, and a plurality of registers connected together as a first scan-chain having an input terminal for receiving data to be shifted into the registers and an output terminal for reading data shifted out of the registers. Each core module also includes a scan-in enable circuit and a scan-out enable circuit. The scan-in enable circuit connects the input terminal of the first scan-chain to the first conductor of the test data bus in response to a first value for the access word. The scan-out enable circuit connects the output terminal of the first scan-chain to an output terminal associated with the core module. The access registers of the core modules are connected together to form an access scan-chain. The access scan-chain has an input terminal accessible from one of the chip input terminals. One of the core modules has an output terminal connected to the second conductor of the test data bus. Core modules may also include other scan-chains used in the testing hardware. In such modules, the scan-in enable circuit further includes circuitry for selecting one of the scan-chains for connection to the first conductor of the test data bus, the selection is determined by the access word. In addition, the scan-out enable circuit further includes circuitry for selecting one of the scan-chains for connection to the output terminal of the core module, the selection is determined by the access word. In the preferred embodiment of the present invention, the first scan-chain provides data values to the core modules that are provided by circuitry external to the core module in the integrated circuit when the integrated circuit is not operating in the test mode. The core modules may be organized in a hierarchy in which one core module is contained within a second core module.

DETAILED DESCRIPTION OF THE INVENTION

For the purposes of the present discussion, a "core" will be defined to be a separate circuit module having a predetermined testing protocol. In general, the core will be embedded in a larger integrated circuit. In addition, the core may be embedded in another core. The present invention is directed to a core design that allows the core's test protocols to be exercised while the core is within the larger circuit.

The present invention is based on the structure and operation of a standardized test hardware architecture that is built into each core. This test hardware is interconnected to the test hardware throughout the circuit system in a manner that allows an individual core to be isolated and tested during the circuit testing protocols. Since the number of test states needed to test a core is significantly less than the number needed to test a circuit consisting of a plurality of cores, a substantial savings in test time is achieved by testing each core separately. In addition, the identity of the non-functioning core can be ascertained.

Figure 1:
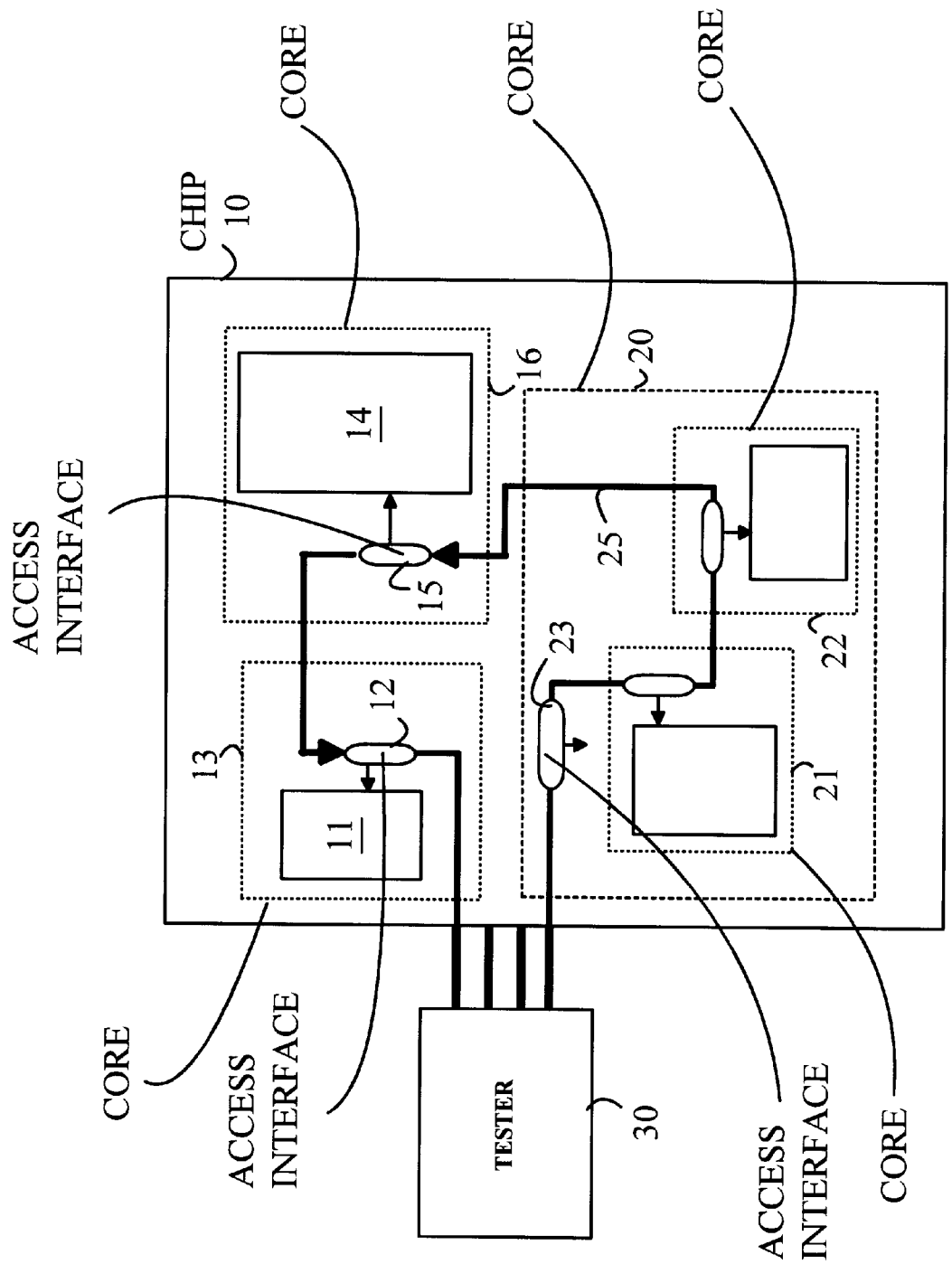
FIG. 1 is a block diagram of a chip according to the present invention connected to a tester.

The manner in which the present invention achieves its advantages may be more easily understood with reference to FIG. 1 which is a block diagram of a chip 10 according to the present invention connected to a tester 30. Chip 10 includes a plurality of cores. Exemplary cores are shown at 13, 16, 20, 21, and 22. Each core includes circuitry that may be connected to a test bus 25 by an access interface during testing. The access interfaces corresponding to cores 13, 16, and 20 are shown at 12, 15, and 23, respectively. The manner in which the access interfaces function will be discussed in detail below.

It should be noted that a core may include other cores. Such a compound core is shown at 20. Core 20 includes cores 21 and 22 together with other circuitry. The circuitry that is specific to core 20, as opposed to its embedded cores, is accessed by access interface 23. The circuitry that is specific to the individual cores is accessed by the access interfaces of those cores.

The access interfaces include an access register for storing an "access word" that determines the behavior of the test circuitry in the cores. The access registers are connected together to form a scan-chain referred to as the access chain in the following discussion. Testing is facilitated by being able to logically isolate a core from the rest of the circuit and controlling the module function independent of surrounding functional logic. However, this does not preclude the capability of activating and controlling a module's state via communication with other parts of the system.

Test-mode access to the core is regulated by the access interface block that is local to the core. General test data, control and scheduling are provided from the tester 30. The chip and cores, may also possess built-in self-test (BIST) functions which can be activated using external commands transmitted via test bus 25 and the access interfaces.

The cores will, in general, include scan logic for loading and reading the registers in the cores. The scan logic, in effect, connects all of the registers in a group together to form a long shift register that may be used to shift data into registers and read the current data values. As will be discussed in more detail below, during test mode the scan access to a core does not require traversing the embedding hierarchy of cores. That is, the functional and scan logic of other cores need not be accessed. A scan-chain associated with the core may be dynamically configured to receive data from one of a subset of the chip Scan-in ports. Similarly, a scan-chain associated with the core may be dynamically configured to assert data to one of a subset of the chip Scan-out ports.

The testing system utilized in a core according to the present invention is based on controlling access to the scan-chains and test hardware already resident to the core. In addition, control, scan and state generation logic is provided for accomplishing tasks such as functionally isolating the core and regulating connectivity to chip level data ports.

Figure 2:
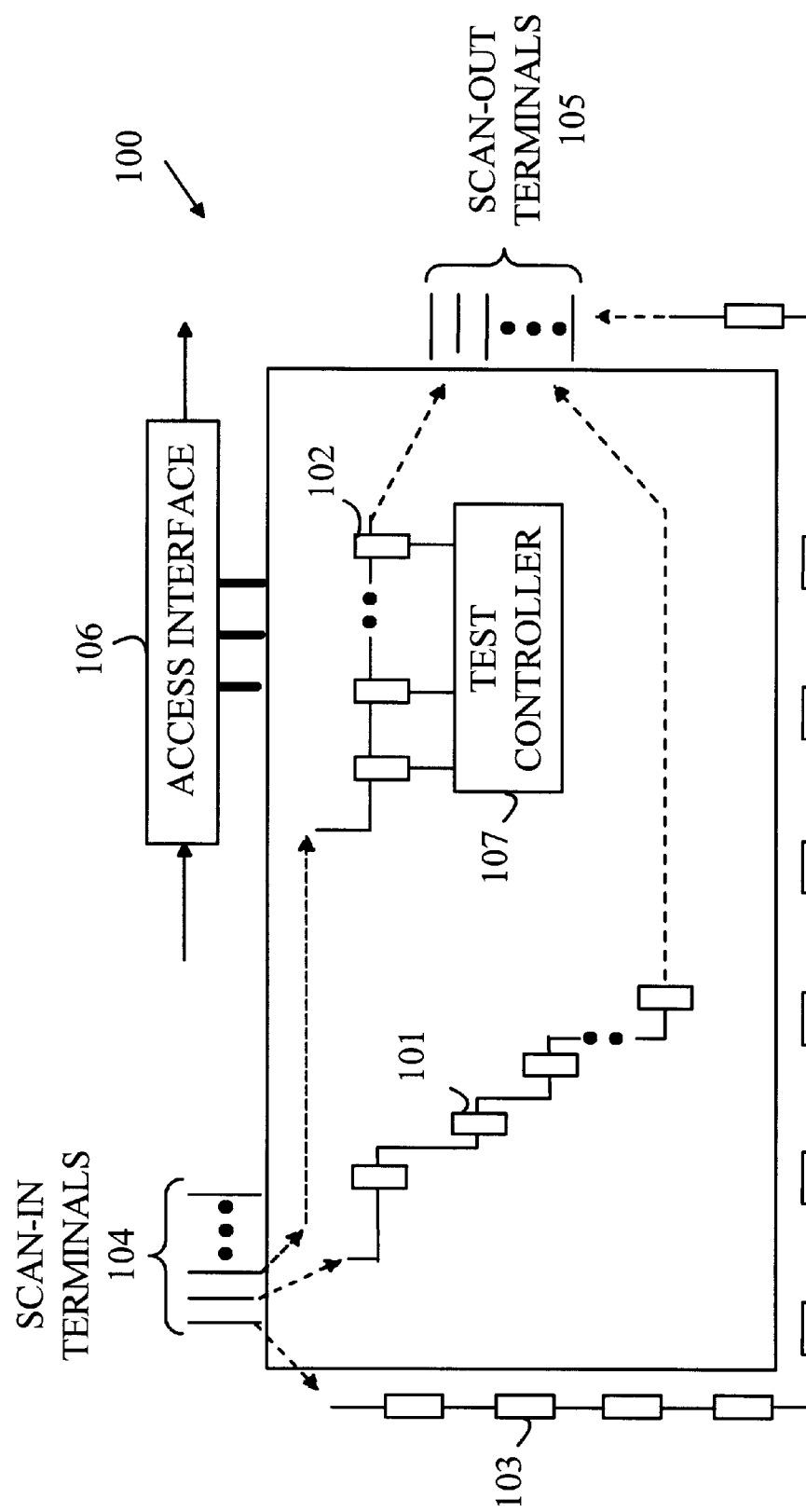
FIG. 2 is a more detailed block diagram illustrating the scan chains in a core according to the present invention.

Refer now to FIG. 2, which is a more detailed block diagram, illustrating the scan chains in a core 100 according to the present invention. Core 100 includes an isolation scan chain 103 positioned at the boundary of the core, one or more internal scan-chains such as scan chain 101, and one or more control word scan-chains such as scan-chain 102. To simplify the nomenclature used in the remainder of this discussion, the isolation ring, internal scan-chains and control word chain of a particular core are referred to as "core-chains". The core-chains are loaded from one or more of the scan-in terminals 104. The data in the registers of the various core-chains can be read through one or more of the scan-out terminals 105.

The isolation ring registers of the isolation core-chain provide the digital logic terminals of the core and connects them in a scan-chain. The isolation chain may be a single scan-chain or may be partitioned into multiple chains. In the preferred embodiment of the present invention, the isolation scan chain is composed of scan cells which do not change their standard output state during shifting; i.e. those with an update function which is separate from their shifting clock. This type of scan-shift is typically termed "non-destructive" to the standard output state.

Figure 3:
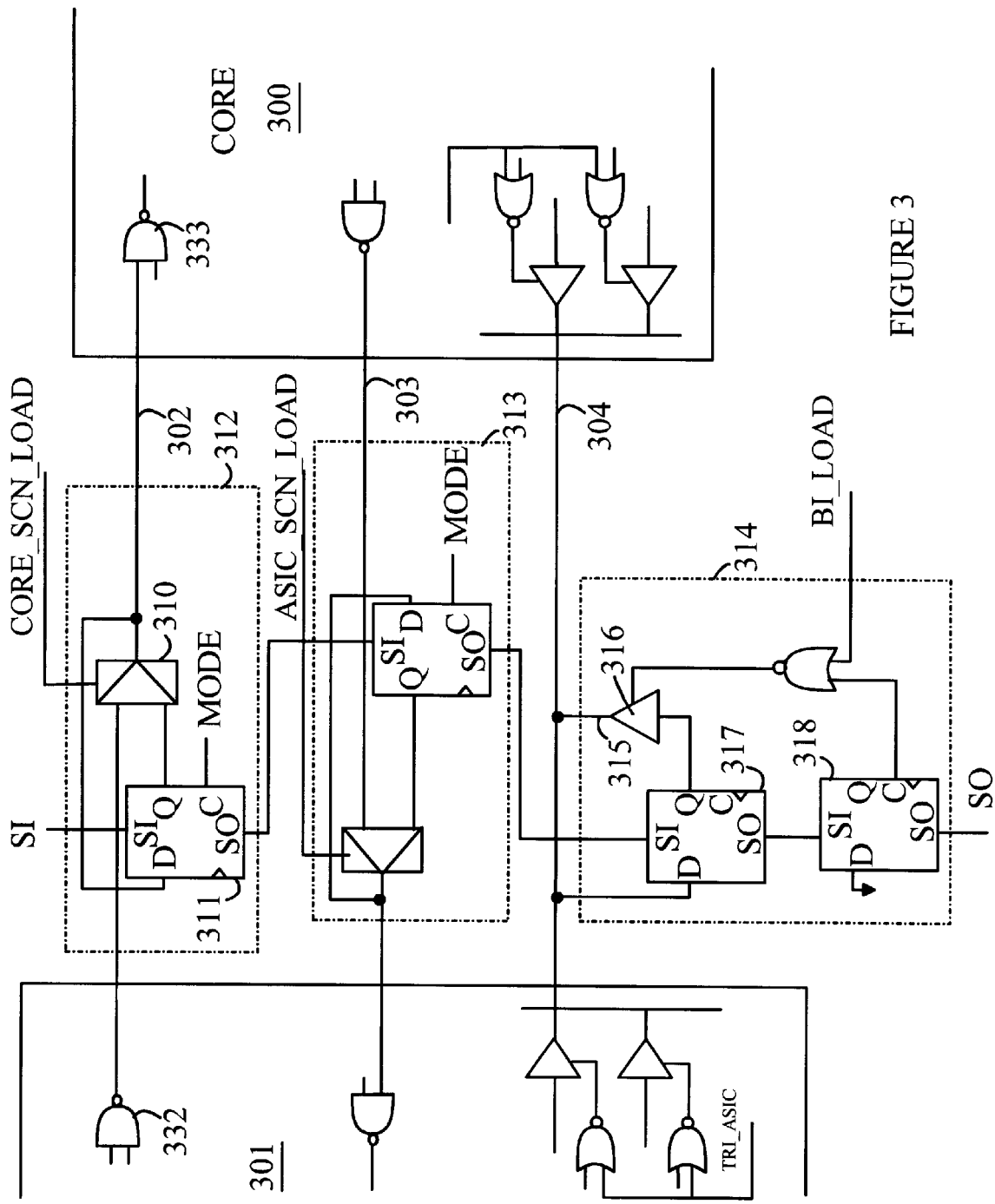
FIG. 3 is a block diagram of a portion of a scan chain inserted between a core and the circuitry surrounding the core.

The manner in which the scan cells of the isolation chain are inserted between the core and the surrounding circuitry can be more easily understood with reference to FIG. 3. FIG. 3 is a block diagram of a portion of a scan chain inserted between a core 300 and the circuitry surrounding the core, which is shown at 301. In general, core 300 has three possible types of connections to the surrounding circuitry 301. The first two connections are unidirectional as shown at 302 and 303. The third type of connection is a bi-directional bus 304. There is a corresponding isolation chain cell for each type of connection.

The unidirectional cells are shown at 312 and 313. One type of unidirectional cell provides data to the corresponding core input line, and the other type receives data from a core output line. In non-test mode, the unidirectional cells appear as connections between the core gates and the corresponding gates in the surrounding circuitry. For example, unidirectional cell 312 connects the output of gate 332 to an input of gate 333 in non-test mode. In test mode, unidirectional cell 312 can select either the output of gate 332 or the output of shift register cell 311 as the input to gate 333 by setting the state of multiplexer 310. The state of multiplexer 310 is set via a control line that is decoded from the corresponding ALB (CORE_SCN_LOAD). Shift register cell 311 may also be used to store the output of gate 332 by setting a control mode signal (MODE) which forces the input to shift register cell 311 to be the signal at its data input rather than the data shifted into the cell via the scan line (SI-SO). Once the data is loaded into the shift register cell, the data can be read externally by shifting the data out using the scan line.

Unidirectional cell 313 operates in a manner analogous to that described above with reference to unidirectional cell 312. Hence, the operation of this type of cell will not be discussed further here.

The third type of scan cell operates on bi-directional bus lines such as bus line 304. In non-test mode, the output 315 of scan cell 314 is disconnected from bus line 304 via tri-state buffer 316. During test mode, the signal on bus line 304 can be provided either by the surrounding circuitry or the contents on shift cell 317 by setting the control line (BI_Load) and/or shifting the appropriate data into shift cell 318. The data on bus line 304 can also be read into shift cell 317 in a manner analogous to that described above with respect to scan cell 312. Once stored in shift cell 317, the data can be shifted out to the test circuitry.

The internal scan-chains are optional. If they exist, they are preferably the same as the internal scan-chains that are normally inserted into the chip logic to be scan tested.

The control word scan-chains are also optional. These dedicated chains are used to provide control words needed by test logic internal to the core. The register values may provide the control words or the chain may be manipulated by an on-core test controller circuit 107 which generates a sequence of test words from the contents of the registers. Control word scan chains facilitate built-in self-test execution, test point operation, and the provision of signal values needed to place the core into a safe idle state or safe test mode state, such as forcing buses to tristate or establishing a low power static state.

The control word scan-chains are preferably constructed from scan cells which can be scan loaded without destroying the chain's output to the surrounding circuit, thus preserving any existing controlled function during the loading. The control word scan-chain can also be used to move test response data to the scan-out terminals.

In a chip constructed from cores according to the present invention, the usual global scan-in ports are provided for loading the various scan-chains. The scan-in terminals of the core access these terminals. Similarly, the scan-out pin of each core-chain maps to a least one scan-out terminal of the core. If a core contains embedded cores, the scan-out terminals of the embedded logic also map to at least one scan-out terminal of the host core. The scan-out terminals of cores embedded at the chip level (top level), map to scan-out ports of the chip.

The access interface of each core includes an Access Logic block (ALB) which controls the test mode access of the core chains. This is preferably accomplished in a manner which flattens the core embedding hierarchy during testing such that any core-chain can be accessed without formally traversing another core. All ALBs are connected into single or multiple scan-chains (Access Chains) which are separate from all other scan-chains on the chip via a scan-chain internal to the ALB. That is, the scan clocks of these chains are not to be shared with any other type of scan-chain controlled by an ALB. Bits of the control word chain can, however, be merged into the ALB. Such embodiments are not preferred because they provide a less modular core design. Typically, a single Access Chain is sufficient.

The ALB carries out three basic functions with respect to the core chains. First, if a scan-in terminal is to be shared among core-chains, the ALB provides the ability to logically connect at least one core-chain to the terminal while disconnecting other core-chains from that terminal. Disconnection is equivalent to a 'hold' mode. Second, the ALB restricts connections to the scan-out terminals such that only one core-chain logically connects to a scan-out terminal at any time. Finally, the ALB assures that a core-chain is logically connected to only one scan-in terminal at any time.

Figure 4:
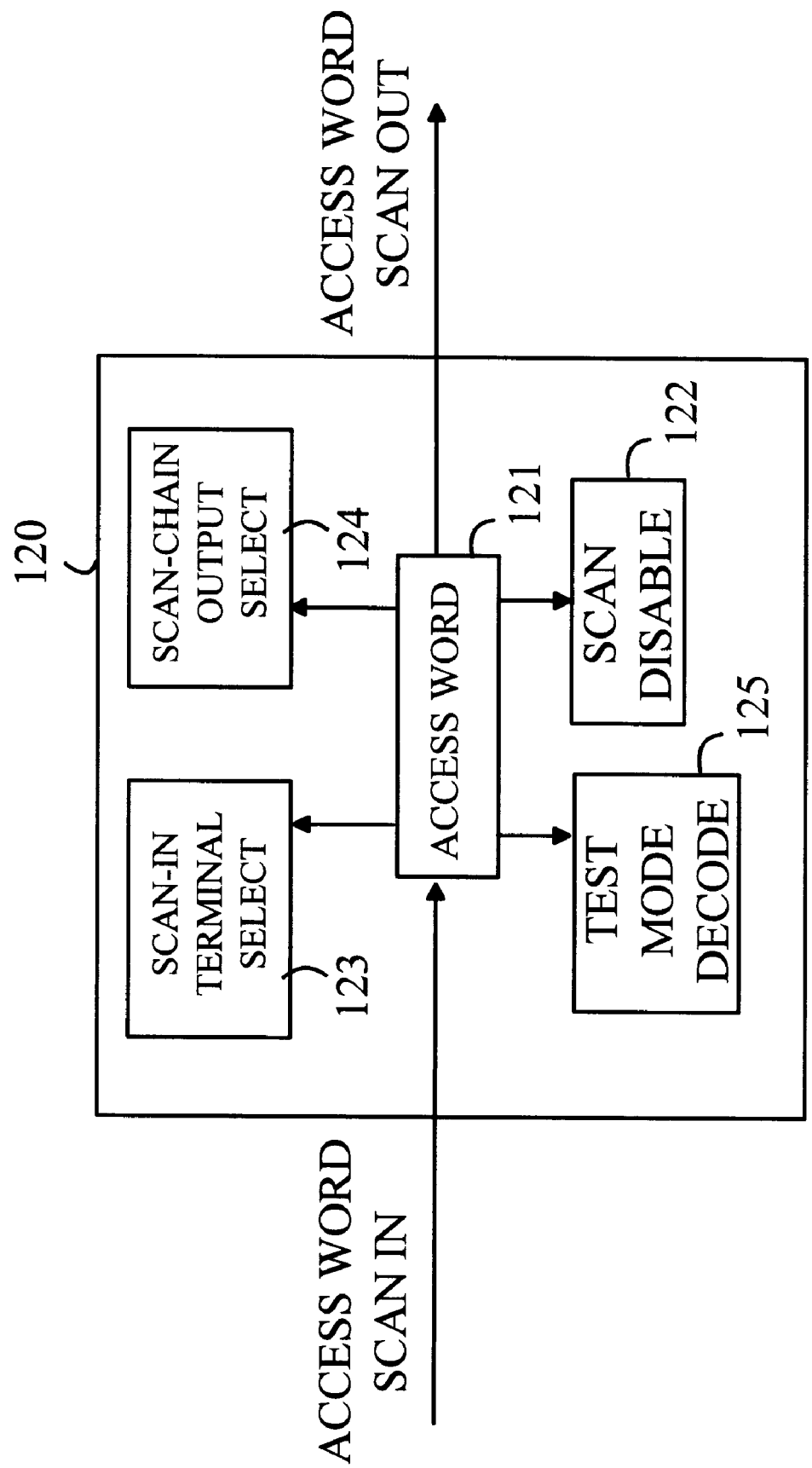
FIG. 4 is a block diagram of an ALB 120 according to the present invention.

Refer now to FIG. 4, which is a block diagram of an ALB 120 according to the present invention. The ALB selects which core-chain of the circuit may receive and send data via a shared scan-in terminal and a shared scan-out terminal. The ALB also provides test mode flags to the associated core logic. In the simplest embodiment of an ALB according to the present invention, 5 logic blocks are utilized to achieve the required functionality. While these logic blocks are shown as compact blocks in the drawing, it is to be understood that portions of the ALB may be physically distributed across the core layout.

The access word 121 includes a short scan chain composed only of cells capable of non-destructive scan shifting. Like the control word chain, this structure is chosen because of its output preservation during a serial load. This property is required as the other ALB blocks operate on fields of the state stored in the access word in the preferred embodiment of the present invention.

An access chain is formed by connecting all access words on a chip. The access word is expected to be short relative to the length of an internal scan-chain; hence, only a single access chain is required for most chip designs. The access chain must remain distinct from all other chains of the system. Also, because of its simplified function, the parallel load feature which accepts functional circuit data into the scan element may be omitted. If this loading feature is retained, the access chain may be used as a bank of observation nodes.

The scan disable logic block 122 is used to select which of the system's scan-chains may receive data from a scan-in terminal. Essentially, the non-receiving chains are placed in a "holding" mode while the others are permitted to load incoming scan data.

The scan-chain output select logic block 124 decodes a field of access word 121 to determine which scan-chain among those local to the core and those embedded within the core may assert its output to a scan-out terminal of the core. In addition, if there is a plurality of scan-out terminals, this block determines the output terminal to which a scan-chain is logically connected.

The test mode decode block 125 provides the logic signals used to control various elements of the core test hardware during test mode. These signals will be discussed in more detail below.

Finally, the scan-in terminal select block 123 selects the scan-in terminal to which a scan-chain is logically connected when a plurality of input data lines are present, To maintain reasonable routing, design modularity, and scan-chain lengths, a number of core-chains may tap data from a common chip-level Scan-in port. Hence, in the preferred embodiment of the present invention, core-chains may share access to a core-level scan-in terminal. The Scan Disable Logic facilitates the access protocol by allowing one or more scan-chains (anywhere on the chip) to "shift-in" the data asserted by a scan-in port while other chains are logically disconnected from this source. If multiple scan-chains simultaneously receive data from a common scan-in source, the chains should either be of equal length or the test data format should account for any imbalance in lengths of the active scan-chains.

In a scan-based design, logical disconnection of a chain from a scan-in terminal can be achieved by forcing the cell's clock and control input signals which are required for scan shifting to an inactive state. In this manner, the shift operation which loads the chain with the data from the scan-in terminal cannot be performed. The contents of the shift-disabled scan chain are further protected by similarly disabling the cell's control inputs that activate the parallel load feature which accepts functional data into the cell. Because of this type of clock and control disabling, the affected chains are thus placed in a "hold" mode in which their internal state does not change.

Figure 5:
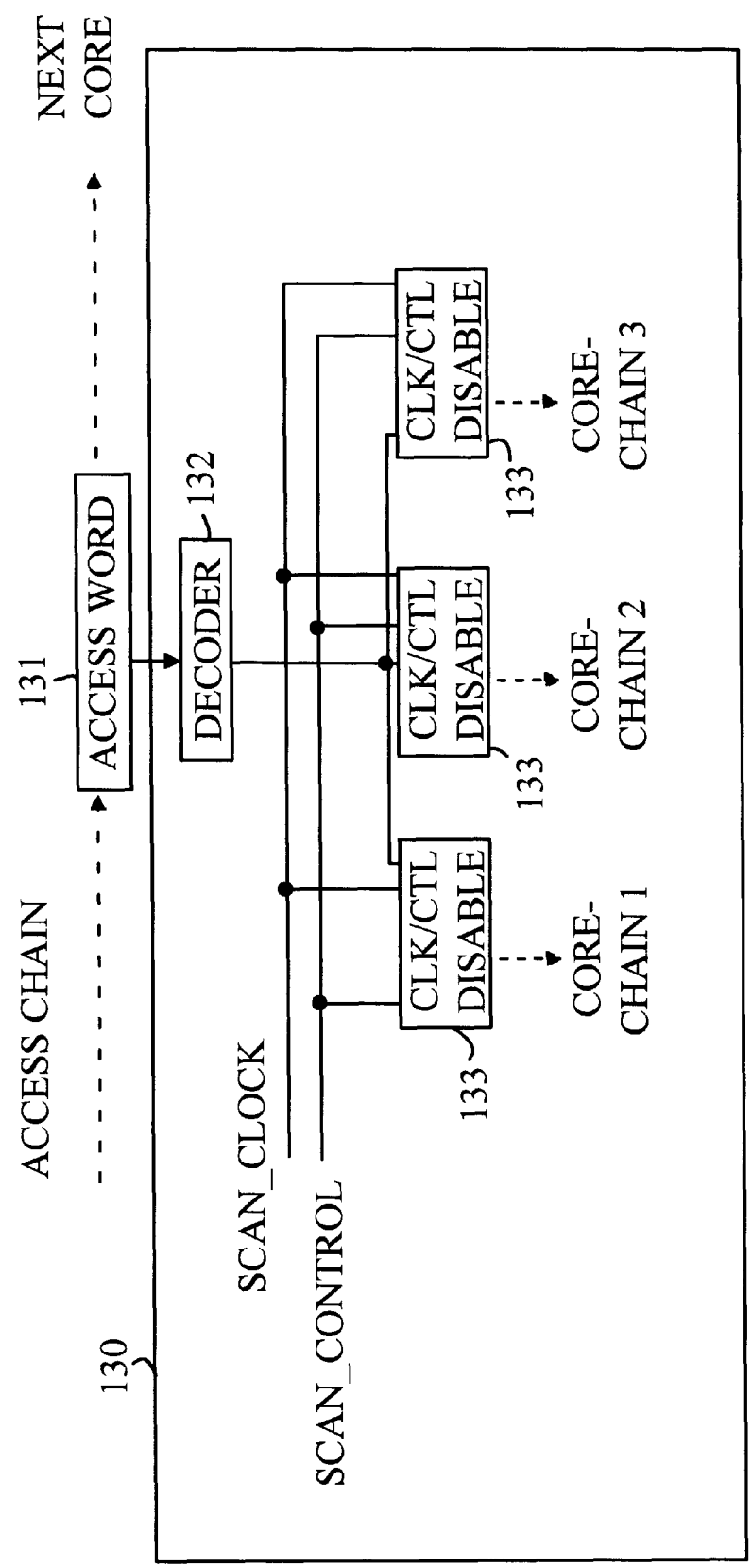
FIG. 5 is a block diagram of an embodiment of a scan disable logic block according to the present invention.

Refer now to FIG. 5 which is a block diagram of an embodiment of a scan disable logic block 130 that may be utilized to implement the above strategy. Access word 131 is decoded by decoder 132 to provide the control signal for disabling the scan clock and master hold nets local to a core-chain via a clock and control disable circuit 133. The clock and control disabling circuits can be constructed from simple logic gates.

In the preferred embodiment of the present invention, a core-chain may be configured to be scan loaded from a selection of scan-in terminals. This enables the degree of parallelism to be increased during testing. The scan-in terminal selection logic block discussed above is used for this purpose. This function is a simple multiplexing function that selects from among the available scan-in terminals. The selection is controlled by a decoded field of the access word. Hence, the selection is programmable. In the trivial case of one scan-in source, this logic block reduces to a direct connection of the bus to the scan-in pin of the scan-chain.

The scan-out terminal select logic block discussed above performs a function that is similar in principle and purpose to the scan-in terminal select logic block. The terminal select logic allows a core-chain to be connected to one of a plurality of scan-out terminals of the core. This function may be implemented as a cross-connect switch for connecting any of the core-chain scan-out lines to any of the scan-out terminals of the core. The choice of connections is controlled by decoding the bits of the access word associated with this function.

The core-based architecture described above is sufficient for testing a hierarchical system of embedded cores. The key is the ability to directly address any scan-chain in any core via the Access Chain. The manner in which this is accomplished may be more easily understood with reference to FIGS. 6 and 7, which are block diagrams of a core 200 having two embedded cores shown at 220 and 230. FIG. 5 illustrates the manner in which data is input to any scan-chain, and FIG. 6 illustrates the manner in which data is output from any scan-chain.

Figure 6:
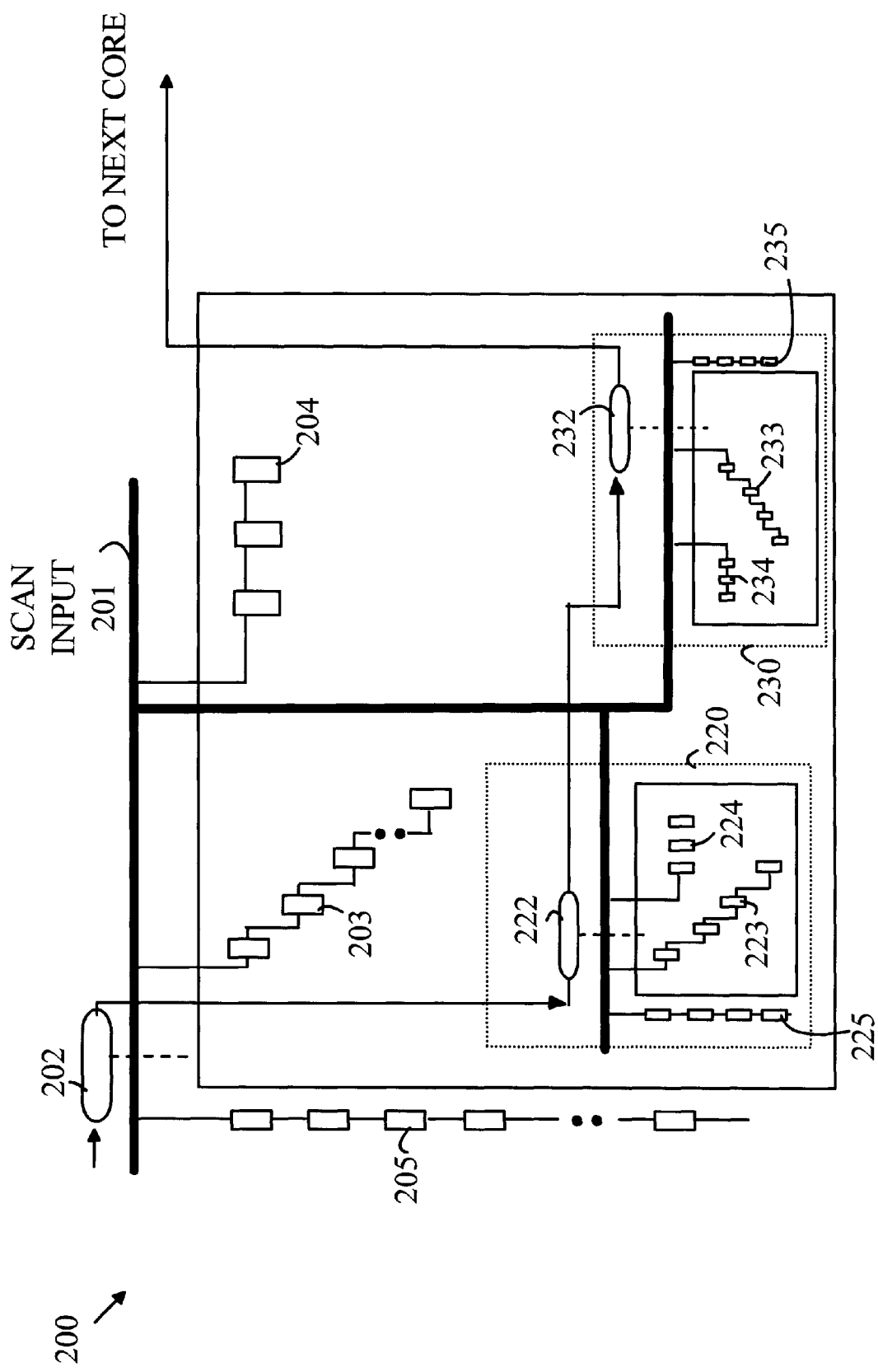
FIG. 6 illustrates the manner in which data is input to any scan-chain in an integrated circuit according to the present invention.

Referring to FIG. 6, the ALBs for cores 200, 220, and 230 are shown at 202, 222, and 232, respectively. The isolation rings ALBs for cores 200, 220, and 230 are shown at 205, 225, and 235, respectively. Cores 200, 220, and 230 are also assumed to have one or more internal scan-chains as shown in FIG. 6 at 203, 223, and 233, respectively, and a control word chain as shown at 204, 224, and 234, respectively.

The ALBs of the cores are connected in series. The scan input data lines 201 are connected to all of the cores in parallel. Any scan-chain can be accessed by first scanning in the appropriate access word which configures the target scan-chain as receiving and the rest as holding. Scan data can then be applied to the active chain. Such access logically flattens the embedding hierarchy. The access chain provides a means of distributing test control signals to any core of the system in a manner similar to supplying information related to scan chain configuration.

Figure 7:
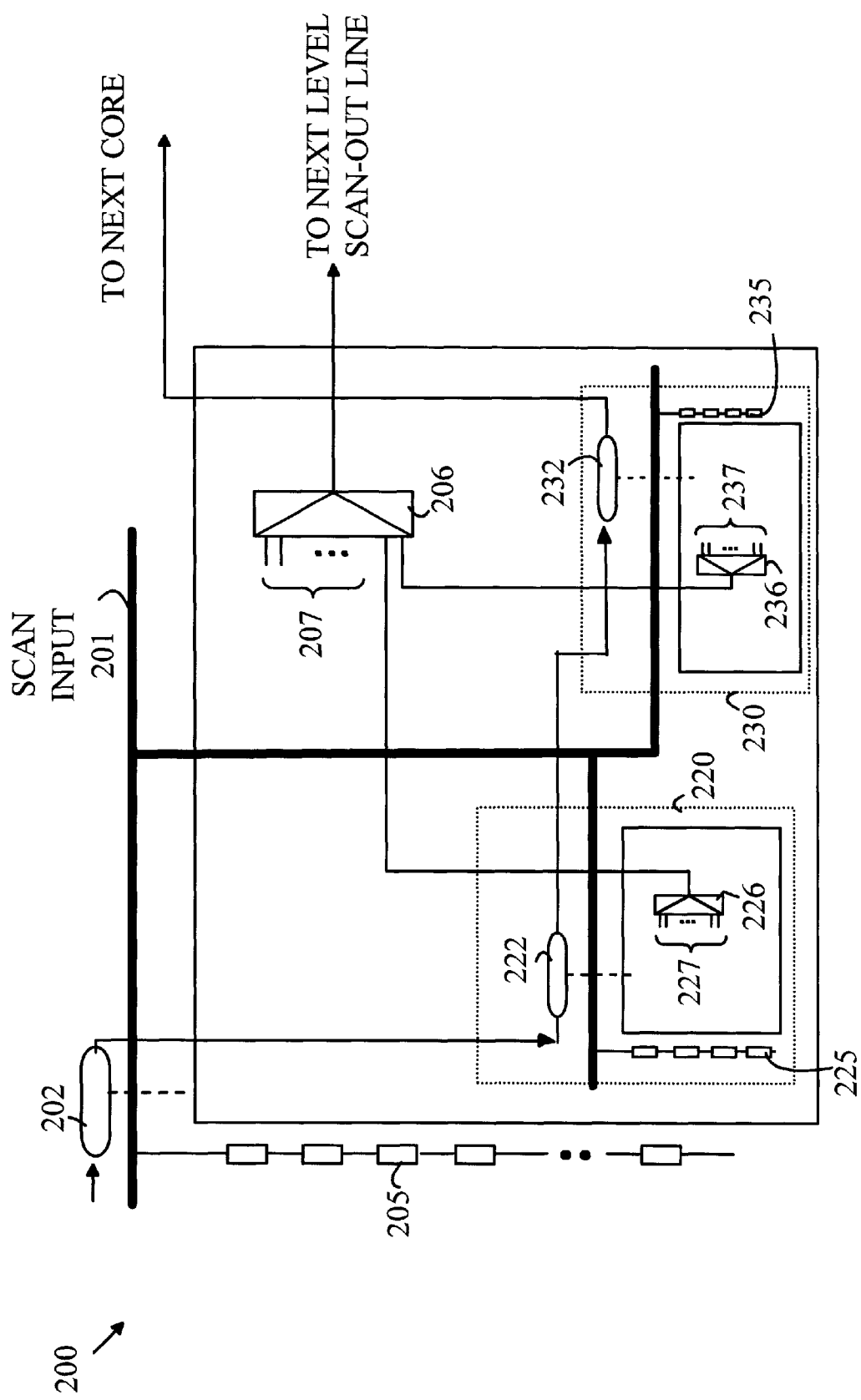
FIG. 7 illustrates the manner in which data is output from any scan-chain in an integrated circuit according to the present invention.

The scan out of a hierarchical system is shown in FIG. 7. To simplify the drawing, the various internal scan-chain and control word chains have been removed. As noted above, each core has one or more scan-out lines, shown at 207, 227, and 237, that are mapped to one or more core level scan-out lines. In the example shown in FIG. 7, each core has one core level scan-out line, which is eventually connected to a chip level scan-out line. Hence, the mapping function is accomplished by a multiplexer associated with each core. The multiplexers associated with cores 200, 220, and 230 are shown at 206, 226, and 236, respectively. The state of the multiplexers is controlled via data in the access word.

Again, a scan-chain is selected to connect to the chip level scan-out port by loading the appropriate access word in the ALB associated with that chain. The access protocol and access word encoding must assure that only one scan-chain may load data to the scan-out bus and that the accessed scan-chain is not in a hold mode.

It can be appreciated from the foregoing discussion that the present invention provides a test hardware system that can be integrated into library modules in ASIC libraries and the like. The test hardware, control, and pattern data required for a core can be defined local to that core. Furthermore, the test protocols for a core may be defined and executed independent of other parts of the system. Through the control-chain structure, the present invention can support activation of special test modes, such as "built-in self-test" operations within a core.

The access-chain provides a mechanism that targets any scan chain within the system using a single scan operation. This access method bypasses or logically "flattens" the physical design hierarchy.

Various modifications to the present invention will become apparent to those skilled in the art from the foregoing description and accompanying drawings. Accordingly, the present invention is to be limited solely by the scope of the following claims.

What is claimed is:

1. An integrated circuit having an embedded testing system, said integrated circuit having a plurality of chip input terminals and a plurality of chip output terminals, said integrated circuit operating in a test mode and a normal mode, said integrated circuit further comprising a plurality of core modules and a test data bus, said test data bus having first and second conductors, said first conductor being accessible from one of said chip input terminals and said second conductor being accessible from one of said chip output conductors, and each core module comprising:
an access register for storing an access word;
a plurality of registers connected together as a first scan-chain having an input terminal for receiving data to be shifted into said registers and an output terminal for reading data shifted out of said registers;
a scan-in enable circuit for connecting said input terminal of said first scan-chain to said first conductor of said test data bus in response to said access word having a first value; and
a scan-out enable circuit for connecting said output terminal of said first scan-chain to an output conductor of said test data bus, wherein said access registers of said core modules are connected together to form an access scan-chain, said access scan-chain having an input terminal accessible from one of said chip input terminals, and wherein one of said core modules has one of said output terminals connected to said second conductor of said test data bus.

2. The integrated circuit of claim 1 wherein one of said core modules further comprises a second plurality of registers connected together as a second scan-chain having an input terminal for receiving data to be shifted into said registers and an output terminal for reading data shifted out of said registers and wherein said scan-in enable circuit further comprises circuitry for selecting one of said first or second scan-chains for connection to said first conductor of said test data bus, said selection being determined by said access word.

3. The integrated circuit of claim 2 wherein said scan-out enable circuit further comprises circuitry for selecting one of said first or second scan-chains for connection to said output terminal of said core module, said selection being determined by said access word.

4. The integrated circuit of claim 1 wherein said registers of said first scan-chain provide data values to said core modules that are provided by circuitry external to said core module in said integrated circuit when said integrated circuit is not operating in said test mode.

5. The integrated circuit of claim 1 wherein one of said core modules further comprises a test controller for performing a test internal to said module, said test generating a result that is stored in said first scan-chain.

6. The integrated circuit of claim 1 wherein one of said core modules comprises circuitry contained within another of said core modules.

* * * * *